United States Patent [19]

Kohl et al.

[11] Patent Number: 4,482,442

[45] Date of Patent: Nov. 13, 1984

[54] PHOTOELECTROCHEMICAL ETCHING OF N-TYPE GALLIUM ARSENIDE

[75] Inventors: Paul A. Kohl; Frederick W. Ostermayer, Jr., both of Chatham, N.J.

[73] Assignee: AT&T Bell Laboratories, Murray Hill, N.J.

[21] Appl. No.: 544,993

[22] Filed: Oct. 24, 1983

Related U.S. Application Data

[63] Continuation-in-part of Ser. No. 281,654, Jul. 9, 1981, abandoned.

[51] Int. Cl.³ ............................ C25F 3/12; C25F 3/14
[52] U.S. Cl. ........................ 204/129.3; 204/129.4; 204/129.6; 204/129.75; 204/129.95
[58] Field of Search ............ 204/129.3, 129.4, 129.75, 204/129.95, 129.6

[56] References Cited

U.S. PATENT DOCUMENTS 3,706,645 12/1972 Lasser ............................ 204/129.3
4,142,953 3/1979 Lovelace ........................ 204/129.3

FOREIGN PATENT DOCUMENTS 2382523 11/1978 France ............................ 204/129.3

OTHER PUBLICATIONS

Hollan et al., "Interpretation of Selective Etching of III-V Compds. on the Basis of Semiconductor Electrochemistry, " J.E.C.S. vol. 126, #5, pp. 855-859, (May 1978).
S. R. Morrison, "The Solid/Liquid Interface", Electrochemistry at Semiconductor and Oxidized Metal Electrodes, Chapter 2, Plenum Press, New York, NY, (1980), pp. 49-78.
Zh. I. Alferov, D. N. Goryachev, A. A. Gurevich, M. N. Mizerov, E. L. Portnoi and B. S. Ryvkin, "Diffraction Gratings Produced on a GaAs Surface by Interference Photoetching", Sov. Phys. Tech. Phys., vol. 21, No. 7, Jul. 1976, pp. 857-859.
D. Lubzens, "Photoetching of InP Mesas for Production of mm-Wave Transferred-Electron Oscillators", Electronics Letters, vol. 13, No. 7, Mar. 31, 1977, pp. 171-172.
F. Kuhn-Kuhnenfeld, "Selective Photoetching of Gallium Arsenide", Journal of the Electrochemical Society: Solid-State Science and Technology, Aug. 1972, pp. 1063-1068.

*Primary Examiner*—Donald R. Valentine
*Attorney, Agent, or Firm*—Walter G. Nilsen

[57] ABSTRACT

A process is described for photoelectrochemically etching n-type gallium arsenide and closely related compound semiconductors such as gallium aluminum arsenide and gallium arsenide phosphide. Such a process is advantageous because the etching is confined to where light is incident to the surface of the semiconductor. In addition, the shape of the configuration etched out of the semiconductor can be controlled by the light incident on the surface of the semiconductor. For example, undercutting can be minimized by use of parallel rays incident on the surface of the semiconductor to be etched.

35 Claims, 2 Drawing Figures

PHOTOELECTROCHEMICAL ETCHING OF N-TYPE GALLIUM ARSENIDE

CROSS REFERENCE TO RELATED APPLICATION

This application is a continuation-in-part of our copending application Ser. No. 281,654, filed July 9, 1981, now abandoned.

TECHNICAL FIELD

The invention is a photoelectrochemical procedure for etching n-type gallium arsenide and related compound semiconductors.

BACKGROUND OF THE INVENTION

Great advancements have been made in semiconductor technology in the last few years largely due to the discovery of new materials and the discovery of new methods of making better materials. These advances have led to new device applications for semiconducting materials and such applications often require different fabrication techniques. Typically, these techniques are aimed towards obtaining smaller size, more precise location of various geometrical features in the device, more accurate shapes for various geometrical features in the structure, greater adherence of metallic substances to semiconductive surfaces, etc.

A particular case in point with regard to gallium arsenide devices is dicing of wafers so as to separate individual semiconductor devices. This is particularly important for gallium arsenide light-emitting devices where anisotropic etching is highly advantageous so as to reduce the amount of material etched.

In fabricating such devices it would be highly advantageous to have an etching procedure which can be controlled as to etch rate, area to be etched, geometrical shape etched, etc. Such an etching procedure is usually referred to as an anisotropic etching procedure. Such a procedure would be useful for making channels, via holes, mirrors, lenses, diffraction gratings, and in the separation of individual chips on a semiconductor wafer.

Photoetching has been carried out on n-type indium phosphide using ferric chloride solution (see D. Lubzens, *Electronics Letters*, Vol. 13, page 171 (1977)). Photoetching of gallium arsenide has been described by F. Kuhn-Kuhnenfeld in an article entitled "Selective Photoetching of Gallium Arsenide" published in *Journal of the Electrochemical Society: Solid-State Science and Technology*, page 1063 (August 1972) and Zh. I. Alferov et al, "Diffraction Gratings Produced on a GaAs Surface by Interference Photoetching," *Soviet Physics Technical Physics*, Vol. 21, No. 7, page 857 (July 1976).

SUMMARY OF THE INVENTION

The invention is a photoelectrochemical etching procedure for n-type gallium arsenide and related semiconductor compounds such as n-type gallium aluminum arsenide and n-type gallium arsenide phosphide. Included in the semiconductor compounds of interest are those compounds containing at least 50 mole percent gallium. The process involves irradiating the area to be etched with light or radiation while the semiconductor is in contact with an aqueous electrolyte solution containing an oxidizing agent and solvating agent (often acid or base) which dissolve the products of the oxidation process. The oxidizing agent should have a reduction potential in the electrolytic solution used (on the hydrogen scale) between the potential of the Fermi level under flat band conditions and the potential of the valence band maximum. In n-type semiconductors the flat band Fermi potential is generally close to the potential of the conduction band minimum. Use of such oxidizing agents ensures oxidation in the presence of light without excessive oxidation in the absence of light. The electrolyte should also be capable of dissolving the oxidation products (e.g., gallium oxide and arsenic oxide as well as aluminum oxide for gallium aluminum arsenide and phosphorous oxide for gallium arsenide phosphide) of the reaction as well as any products formed between the oxidizing agent and the oxidation products. Typical oxidation agents for acid solution were ferric ion (e.g., $FeCl_3$, $Fe_2(SO_4)_3$) pentavalent vanadium (e.g., $NaVO_3$), hexavalent chromium (e.g., $CrO_3$), bromine or iodine in water and quadravalent iridium (e.g., $IrCl_6^{-2}$). Hydrochloric acid is a particularly convenient acidifying agent because the chloride ion helps dissolve certain oxidation products such as aluminum oxide.

The products of the oxidation can often be kept in solution by adjustment of the pH to below 4 to above 8. A particularly convenient system for compound semiconductors that contain aluminum but not phosphorous (e.g., GaAlAs) is aqueous HCl with $FeCl_3$ as an oxidizing agent.

For semiconductors without aluminum or phosphorous (e.g., GaAs), aqueous $H_2SO_4$ with $Fe_2(SO_4)_3$ is usually more appropriate. For compound semiconductors with phosphorous, ferric ion should not be used and aqueous HCl with $CrO_3$ is usually more appropriate. This procedure yields excellent anisotropic etching with minimum of etching in dark nonilluminated areas. This procedure is particularly advantageous when used with a mask to make straight-sided holes and channels without the usual facets resulting with isotropic etching procedures.

DETAILED DESCRIPTION

Figure 1:
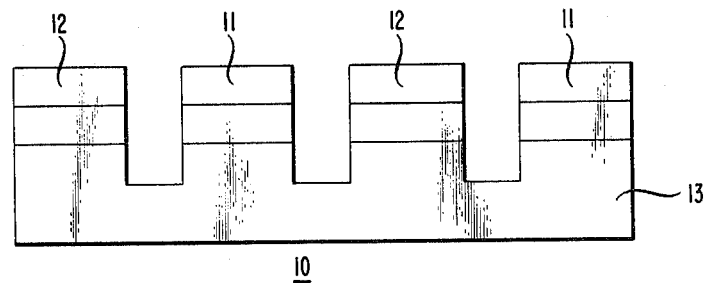
FIG. 1 shows a side view of an optoisolator with light-emitting diode and detector made in accordance with the invention.

The invention is a photoelectrochemical procedure for etching n-type gallium arsenide and related compounds such as n-type gallium aluminum arsenide and n-type gallium arsenide phosphide. Generally, related gallium arsenide compound semiconductors are those with at least approximately 50 mole percent gallium. Also included in gallium arsenide. Particularly important, in addition to gallium arsenide itself, is the mixed compound semiconductor $Ga_{1-x}Al_xAs$ with x ranging from 0 to 0.35. Also of importance is the mixed compound semiconductor $GaAs_{1-x}P_x$ with x ranging from 0 to 1. Varying the composition alters the energy of the forbidden gap and often the nature of the transition between the conduction band and the valence band.

The compound semiconductor is made n-type by convenient means, including doping with tin, sulfur, selenium, tellurium, silicon, etc. Generally, the doping range is from $10^{15}$ to $10^{19}$ atoms per cubic centimeter with the range from $10^{16}$ to $10^{18}$ atoms per cubic centimeter preferred for many applications. Such n-type compound semiconductors are useful in bulk or as layers grown epitaxially.

The etching procedure is carried out by illuminating the part of the semiconductor surface to be etched with radiation of sufficient photon energy to ensure the creation of carriers. Generally, the photon energy of the radiation should be at least as great as the band gap of the semiconductors. Both monochromatic and broad band radiation sources may be used. In general, the rate of etching depends on the intensity of the radiation incident of the semiconductor surface. This property, together with the direction of radiation, may be used to etch various geometric shapes on the surface of the semiconductor. For example, to etch a straight-walled hole or channel, a mask may be used together with parallel rays of radiation to ensure etching straight down into the hole. In addition, variations in the intensity of the radiation over the surface can be used to make various geometric shapes. For example, a lens might be etched by suitable variation of intensity over a radiation spot on the surface of the semiconductor.

The etching procedure is carried out while the semiconductor is at least partially immersed in an electrolytic solution. This solution should contain a suitable oxidizing agent, an agent that ensures dissolution of the oxidation products of the etching procedure and optionally a buffer to stabilize the pH of the solution. Most important is the oxidizing agent which ensure continuity of the oxidation-reduction reaction. The oxidizing agent should not be too strong or too weak. For example, it should ensure oxidation in the presence of suitable radiation, but should not lead to excessive oxidation in nonradiated portions of the semiconductor. In addition, it is important to avoid oxidizing agents or other reagents in the electrolytic solution which precipitate the oxidation products of the gallium arsenide or related semiconductor undergoing the etching procedure. A particular case in point concerning gallium phosphide and gallium arsenide phosphide is the avoidance of ferric or ferrous salts which might form a precipitate on exposure to require mechanical removal of the precipitated reagents.

Selection of the oxidizing agent suitable for carrying out the process may be made on theoretical grounds, by carrying out certain simple measurements or a combination of the two approaches. In broad terms, the oxidizing agent should produce etching in the presence of light of suitable energy but (at least ideally) not produce any etching in the absence of light. In addition, the oxidizing agent and its products should be compatible with the etching process. For example, the oxidizing agent should not form a precipitate with the oxidation product of the etching process.

In an n-type compound semiconductor, the Fermi potential is quite close to the potential at the minimum of the conduction band (see *Electrochemistry at Semiconductor and Oxidizing Metal Electrodes* by S. Roy Morrison, Plenum Press, New York (1980), especially Chapter 2). For this reason, the criteria for suitable oxidizing agents for n-type material may be put in terms of the potential for the conduction band minimum (here referred to as the conduction band potential) and the potential of the valence band maximum (here referred to as the valence band potential). The oxidizing agent used in the process should have a reduction potential (in the electrolytic solution used) between the conduction band potential and the valence band potential. Such an oxidizing agent would produce oxidation in the presence of radiation that created carriers in the valence band and the conduction band but not produce excessive etching in the absence of radiation. Often, precise information on these quantities for different electrolytic solutions and pH values and for different compositions of the compound semiconductors is not available. For this reason, theoretical considerations often give only an approximate idea of suitable oxidizing agents.

Various rough estimates are made of the conduction band potential and the valence band potential for a variety of electrolytic solutions. The following estimates are for acid solution (pH about 4). For n-type GaAs, the conduction band potential ($E_c$) is roughly $-0.7$ volts; the valence band potential ($E_v$) is about $+0.7$ volts. These potentials are given on the hydrogen electrochemical scale. For n-type $Ga_{0.65}Al_{0.35}As$, $E_c$ and $E_v$ are roughly $-1.0$ and $+0.7$ volts, respectively. For n-type GaP, $E_c$ and $E_v$ are approximately $-1.1$ and $+1.2$ volts. For $GaAs_{0.5}P_{0.5}$, $E_c$ and $E_v$ are approximately $-0.8$ and $+1.2$, respectively. Typical oxidizing agents are trivalent iron (e.g., $FeO_3$, $Fe_2(SO_4)_3$) pentavalent vanadium (i.e., $NaVO_3$), hexavalent chromium (i.e., $CrO_3$), bromine or iodine in water and quadravalent iridium (i.e., $IrCl_6^{-2}$).

In basic solution, the conduction band potential and the valence band potential are generally more negative (usually about 50 millivolts per pH unit) so that the selection of an oxidizing agent is often somewhat different. Typical oxidizing agents are $S^{-2}$ as in $Na_2S$, $Se^{-2}$ as in $Na_2Se$, $Te^{-2}$ as in $Na_2Te$, trivalent cobalt as in $Co(NH_3)_5^{+3}$ and $Co(CN)_6^{-3}$, divalent copper as in $Cu(NH_3)_4^{+2}$ and iodate ion as in $NaIO_3$. Even where the potentials are accurately known, the range of permissible reduction potentials for the oxidizing agents are not precisely defined. For example, near the positive limit of the range there might be more etching in the absence of light than desirable, and close to the negative limit the etch rate might be less than desirable.

A procedure is available for testing the characteristics of a particular oxidizing agent and matching them to the electrochemical properties of a semiconductor in a particular electrolytic solution. This procedure involves taking a voltammogram of the compound semiconductor in the solution of interest with and without light illuminating its surface. A voltammogram is a plot of current versus potential applied to the compound semiconductor with respect to a reference electrode. With surface illumination, the initial output of current (as the potential on the hydrogen scale is made more and more positive) represents approximately the conduction band potential in that particular electrolytic solution. Without illumination, the initial increase in current is usually positive of the potential of the valence band maximum. The reduction potential of the oxidizing agent in the electrolytic solution to be used in the process should be between these two potentials (the conduction band potential and the valence band potential).

Indeed, where uncertainty exists as to the electrochemical properties of the oxidizing agent a voltammogram can be run on the oxidizing agent in the electrolytic solution of interest. Here, the ideal oxidizing agent should show no reduction current at a potential more positive than the potential at the valence band maximum (where oxidation current first appeared in the dark in the voltammogram of the compound semiconductor), but shows reduction current between the above potential and the potential of the Fermi level under flat band conditions. Such experiments can be done rapidly and easily so as to select suitable oxidizing agents for this process. Also, the shape of the voltammogram and comparison between the voltammogram of the compound semiconductor and oxidizing agent should yield some information about likely etching rates.

Typical concentration ranges for the oxidizing agent are from 0.1 Molar to saturation. Below 0.1 Molar the reaction might tend to be overly slow and frequent replenishment of the solution might be necessary. Preferred concentration ranges are from 0.5 to 1.5 Molar. Lower concentrations tend to yield inconveniently slow etching, whereas higher concentrations sometimes yield etching even in the dark; and such high concentrations are not usually overly beneficial as far as etching rate.

It is also of importance to ensure that the etching product or oxidation product of the compound semiconductor dissolves rapidly in the electrolytic solution. This can be accomplished in a number of ways. Certain ions present in the solution (complexing ions, solvating ions) might enhance the rate of dissolution. Acidic solution (generally pH values less than 4) ensure rapid dissolution of gallium oxide and arsenic oxide. In addition, the presence of chloride ion ensures rapid dissolution of aluminum oxidation products. For this reason, it is preferred that the reaction be carried out in aqueous hydrochloric acid with pH less than 4. More preferred is a hydrochloric acid solution with concentration greater than 0.1 Molar. Most preferred is a 1 Molar solution of hydrochloric acid. Dissolution of the oxidation products may also be achieved using a highly basic solution, preferably with pH greater than 8. The solution can be made basic in a variety of ways, including the addition of alkali metal hydroxide. The presence of chloride ion is still helpful in dissolving various oxides including aluminum oxide where the compound semiconductor contains aluminum. Generally, the basic solution should not interfere with the oxidation characteristics of the reactants.

Reactions take place on two parts of the surface of the semiconductor. The oxidation reaction takes place on the surface of the compound semiconductor that is n-type. This oxidation reaction only takes place in the presence of light. The reduction reaction in which the oxidizing agent is reduced takes place in a part of a semiconductor which is either metallic or p-type. Most conveniently in the fabrication of semiconductor devices this takes place on a metallic mask or coating such as a gold layer attached to the semiconductor surface. Both the region where oxidation takes place and the region where reduction takes place are immersed in the electrolytic solution.

Various substances may be added to the electrolytic solution so as to lead to more rapid dissolution of the oxidation products of the etching process. These might be various complexing agents as well as the acid or bases mentioned above.

FIG. 1 shows a side view of an array 10 of light-emitting diodes 11 and detector 12 that form the structure of an optoisolator. The common substrate 13 is semi-insulating gallium arsenide and the layers are n-type gallium aluminum arsenide 14 and p-type gallium aluminum arsenide 15. The cuts between the light-emitting diode and detector are conveniently etched in accordance with the invention.

Figure 2:
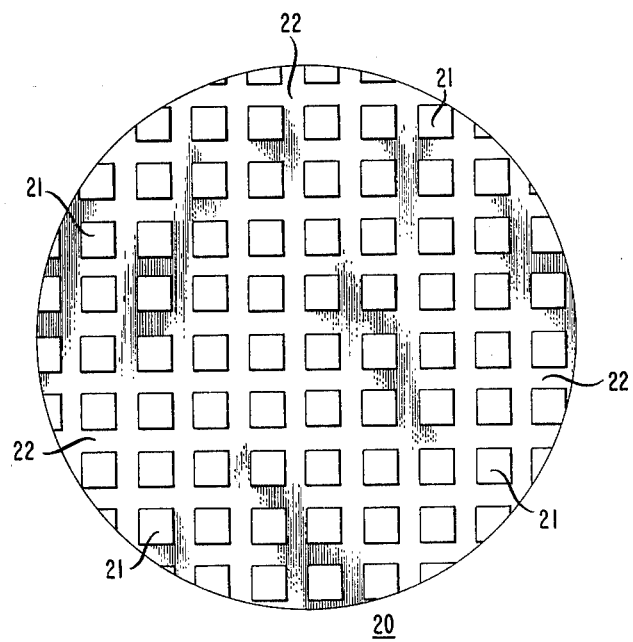
FIG. 2 shows a top view of a semiconductor wafer in which the individual devices have been etched apart by a process in accordance with the invention.

FIG. 2 is a semiconductor wafer 20 in which individual semiconductor chips 21 are diced by etching channels 22 between individual chips in accordance with the invention.

A particularly important part of the invention is the photoelectrochemical etching process applied to III-V compound semiconductors containing aluminum. Such compounds are important commercially for a variety of reasons. For example, light-emitting diodes made of gallium aluminum arsenide emit at shorter wavelengths (including in the red) than gallium arsenide. Short wavelength semiconductor lasers can also be made of aluminum-containing III-V compounds. Particularly important are compounds with the general formula $Ga_{1-x}Al_xAs$ where x is less than 0.35.

Other aluminum-containing III-V semiconductor compounds are also of interest and commercial importance. For example, InAlAs is of interest for a variety of applications including an integrated, long-wavelength detector-amplifier for light wave detection. Here, the InAlAs is lattice matched to InP to form a field-effect transistor. Other aluminum-containing compounds are GaAlSb and InGaAlP, useful for visible lasers. Still other aluminum-containing semiconductors are AlP, AlAs, AlSb and GaAlAsSb.

Compound semiconductors containing aluminum present special problems because of the difficulty in dissolving the oxidation product of aluminum, namely $Al_2O_3$. For this reason, certain electrolytic solutions yield better results (in terms of etch rate, smoothness of the etched surface, etc.) than other electrolytic solutions. For photoelectrochemically etching III-V compound semiconductors containing aluminum, particularly good results are obtained with the following electrolytic solutions:

1. Ferric ion in aqueous acid solution. The ferric ion, usually added as $Fe_2O_3$, $FeCl_3$, $Fe_2(SO_4)_3$, may have a concentration in the range from 0.01 Molar to saturation, preferably 0.01 to 0.1 Molar. A strong acid is preferred (HCl, $HNO_3$, $H_2SO_4$) with concentration in the range from 0.1 to 10 Molar.

2. Hexavalent chromium in aqueous acid solution. The hexavalent chromium ion is typically added in the form of $CrO_3$ and should have a concentration between 0.01 Molar and saturation and preferably in the range from 0.01 to 0.1 Molar. Strong acids are preferred such as $HNO_3$ and $H_2SO_4$ with typical concentration in the range from 0.1 to 10 Molar. The acid HCl is also useful but generally used where the concentration of aluminum in the semiconductor is low.

3. Bromine in various aqueous solutions including alkaline solutions with pH greater than 10 and a bromide buffer solution containing bromide ion and HBr. The bromine should have a concentration between 0.01 Molar and saturation, with 0.01 to 0.1 Molar preferred. A strong base is preferred for the alkaline solution such as NaOH with concentration in the range from 0.1 to 10 Molar. For the buffer solution, the total bromide concentration ($Br^-$ plus HBr) should be in the range from 0.1 to 10 Molar with the ratio of $Br^-/HBr$ from 1:10 to 10:1.

Hydrogen peroxide is also useful for a variety of III-V compound semiconductors, especially those (with or without aluminum) which have large band gaps (GaP, InGaAlP, etc.). Hydrogen peroxide is useful over a wide range of concentrations but best results are obtained in the range from about 0.5 to 5.0 weight percent. Generally, an acidic aqueous solution is preferred in which the solution is made acidic with HCl.

What is claimed is:

1. A process for fabricating devices comprising at least one n-type III–V compound semiconductor in which the compound semiconductor comprises at least 50 mole percent gallium and the process comprises at least one step in which the n-type semiconductor compound is photoelectrochemically etched by an oxidation-reduction reaction in an electrolytic solution characterized in that
   a. the oxidation is carried out by illuminating the n-type III–V compound semiconductor with radiation comprising photon energy at least as great as the band gap of the compound semiconductor so as to produce holes that permit oxidation of the compound semiconductor,
   b. the electrolytic solution comprises one or more oxidizing agents with reduction potentials in the electrolytic solution between the potential of the conduction band minimum and the potential of the valence band maximum and with the total concentration of oxidizing agent between 0.1 molar and saturation, and
   c. the oxidizing agent is reduced on a metallic or p-type surface electrically connected to the III–V compound semiconductor.

2. The process of claim 1 in which the III–V compound semiconductor is selected from the group consisting of gallium arsenide, gallium aluminum arsenide, and gallium arsenide phosphide.

3. The process of claim 2 in which the III–V compound semiconductor has the formula $GaAs_{1-x}Al_xAs$ in which x ranges from 0 to 0.35.

4. The process of claim 1 in which the compound semiconductor has the formula $GaAs_{1-x}P_x$ in which x ranges from 0 to 1.

5. The process of claim 1 in which the electrolytic solution is acidic.

6. The process of claim 5 in which the electrolytic solution is made acidic by the addition of hydrochloric acid.

7. The process of claim 6 in which the reduction potential of the oxidizing agent on the hydrogen scale ranges from $-1.1$ to $+1.2$ volts.

8. The process of claim 7 in which the oxidizing agent is selected from the group consisting of trivalent iron, pentavalent vanadium, hexavalent chromium, bromine in water, iodine in water, and quadravalent iridium.

9. The process of claim 8 in which the electrolytic solution contains aqueous hydrochloric acid and ferric chloride.

10. The process of claim 1 in which the concentration of the oxidizing agent ranges from 0.5 to 1.5 Molar.

11. The process of claim 1 in which the electrolytic solution has a pH greater than 8.

12. The process of claim 11 in which the oxidizing agent is selected from the group consisting of divalent sulfur ion, divalent selenium ion, divalent tellurium ion, trivalent cobalt ion, and iodate ion.

13. The process of claim 1 in which the radiation is produced by a laser source.

14. The process of claim 1 in which the III–V compound semiconductor is doped with an element selected from the group consisting of tin, silicon, sulfur, selenium, and tellurium in the concentration range from $10^{15}$ and $10^{19}$ atoms per cubic centimeter.

15. The process of claim 14 in which the concentration range is from $10^{16}$ to $10^{18}$ atoms per cubic centimeter.

16. A device made by the process of claim 1.

17. The process of claim 1 in which the oxidizing agent comprises hydrogen peroxide.

18. The process of claim 17 in which the electrolytic solution is acidic.

19. The process of claim 18 in which the electrolytic solution is made acidic with hydrochloric acid.

20. A process for fabricating devices comprising at least one n-type III–V compound semiconductor in which the compound semiconductor comprises aluminum and the process comprises at least one step in which the n-type semiconductor compound is photoelectrochemically etched by an oxidation-reduction reaction in an electrolytic solution characterized in that
   a. the oxidation is carried out by illuminating the n-type III–V compound semiconductor with radiation comprising photon energy at least as great as the band gap of the compound semiconductor so as to produce holes that permit oxidation of the compound semiconductor,
   b. the electrolytic solution comprises one or more oxidizing agents with reduction potentials in the electrolytic solution between the potential of the conduction band minimum and the potential of the valence band maximum,
   c. the oxidizing agent is reduced on a metallic or p-type surface electrically connected to the III–V compound semiconductor, and
   d. the oxidizing agent is selected from the group consisting of ferric ion, elemental bromine, hexavalent chromium, and hydrogen peroxide.

21. The process of claim 20 in which the oxidizing agent is ferric ion in an aqueous acid solution.

22. The process of claim 21 in which the aqueous acid solution comprises at least one strong acid selected from the group consisting of hydrochloric acid, nitric acid, and sulfuric acid.

23. The process of claim 22 in which the concentration of acid ranges from 0.1 to 10 Molar.

24. The process of claim 23 in which the ferric ion concentration ranges from 0.01 Molar to saturation.

25. The process of claim 20 in which the oxidizing agent is hexavalent chromium and the electrolytic solution is an aqueous acid solution.

26. The process of claim 25 in which the hexavalent chromium is added as $CrO_3$ and the chromium concentration is between 0.01 Molar and saturation.

27. The process of claim 26 in which the electrolytic solution is made acidic with a strong acid selected from the group consisting of hydrochloric acid, nitric acid, and sulfuric acid.

28. The process of claim 27 in which the concentration of acid ranges from 0.1 to 10 Molar.

29. The process of claim 20 in which the oxidation agent is bromine in an alkaline solution with pH greater than 10.

30. The process of claim 29 in which the bromine concentration is between 0.01 Molar and saturation.

31. The process of claim 30 in which the electrolytic solution is made alkaline by the addition of a strong base.

32. The process of claim 31 in which the total bromide concentration ($Br^-$ and HBr) is between 0.1 and 10 Molar and the ratio of bromide ion to HBr is from 1:10 to 10:1.

33. The process of claim 20 in which the oxidizing agent is hydrogen peroxide.

34. The process of claim 33 in which the electrolytic solution is acidic.

35. The process of claim 34 in which the electrolytic solution is made acidic with hydrochloric acid.

* * * * *